(12) United States Patent
Cho et al.

(10) Patent No.: US 11,670,665 B2
(45) Date of Patent: *Jun. 6, 2023

(54) OPTO-ELECTRONIC DEVICE HAVING JUNCTION FIELD-EFFECT TRANSISTOR STRUCTURE AND METHOD OF MANUFACTURING THE SAME

(71) Applicant: SAMSUNG ELECTRONICS CO., LTD., Suwon-si (KR)

(72) Inventors: Kyungsang Cho, Gwacheon-si (KR); Hojung Kim, Suwon-si (KR); Chanwook Baik, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 209 days.

This patent is subject to a terminal disclaimer.

(21) Appl. No.: 16/919,328

(22) Filed: Jul. 2, 2020

(65) Prior Publication Data
US 2021/0249453 A1 Aug. 12, 2021

(30) Foreign Application Priority Data
Feb. 6, 2020 (KR) .................. 10-2020-0014354

(51) Int. Cl.
*H01L 27/146* (2006.01)
*H01L 31/0352* (2006.01)
*H01L 31/112* (2006.01)

(52) U.S. Cl.
CPC .... *H01L 27/14679* (2013.01); *H01L 27/1461* (2013.01); *H01L 27/1462* (2013.01);
(Continued)

(58) Field of Classification Search
CPC ......... H01L 27/14679; H01L 27/14612; H01L 31/1129; H01L 31/035218; H01L 27/14609
See application file for complete search history.

(56) References Cited

U.S. PATENT DOCUMENTS 7,728,890 B2 6/2010 Suzuki
7,989,860 B2 8/2011 Park
(Continued)

FOREIGN PATENT DOCUMENTS

JP 4491323 B2 6/2010
JP 2010232435 A 10/2010
(Continued)

*Primary Examiner* — Aaron J Gray
(74) *Attorney, Agent, or Firm* — Sughrue Mion, PLLC

(57) ABSTRACT

Provided are opto-electronic devices with low dark noise and high signal-to-noise ratio and methods of manufacturing the same. An opto-electronic device may include: a semiconductor substrate; a light receiving unit formed in the semiconductor substrate; and a driving circuit arranged on a surface of the semiconductor substrate. The light receiving unit may include: a first semiconductor layer partially arranged in an upper region of the semiconductor substrate and doped with a first conductivity type impurity; a second semiconductor layer arranged on the first semiconductor layer and doped with a second conductivity type impurity; a transparent matrix layer arranged on an upper surface of the second semiconductor layer; a plurality of quantum dots arranged to contact the transparent matrix layer; and a first electrode and a second electrode electrically connected to the second semiconductor layer and respectively arranged on both sides of the transparent matrix layer.

6 Claims, 19 Drawing Sheets

(52) U.S. Cl.
CPC .. *H01L 27/14612* (2013.01); *H01L 27/14683* (2013.01); *H01L 31/035218* (2013.01); *H01L 31/1129* (2013.01)

(56) References Cited

U.S. PATENT DOCUMENTS

| | | | |
|---|---|---|---|
| 9,812,596 B2 | 11/2017 | Cho et al. | |
| 10,529,879 B2 | 1/2020 | Cho et al. | |
| 11,302,740 B2* | 4/2022 | Cho | H01L 27/14679 |
| 2016/0020352 A1* | 1/2016 | Konstantatos | H01L 31/035218 |
| | | | 438/94 |
| 2018/0061882 A1* | 3/2018 | Lee | H01L 27/14634 |
| 2019/0189815 A1* | 6/2019 | Cho | H01L 31/0336 |
| 2019/0363215 A1* | 11/2019 | Adinolfi | H01L 31/02019 |

FOREIGN PATENT DOCUMENTS

| | | |
|---|---|---|
| KR | 1020170033734 A | 3/2017 |
| KR | 1020190072967 A | 6/2019 |

* cited by examiner

OPTO-ELECTRONIC DEVICE HAVING JUNCTION FIELD-EFFECT TRANSISTOR STRUCTURE AND METHOD OF MANUFACTURING THE SAME

CROSS-REFERENCE TO RELATED APPLICATION

This application is based on and claims priority from Korean Patent Application No. 10-2020-0014354, filed on Feb. 6, 2020, in the Korean Intellectual Property Office, the disclosure of which is incorporated herein in its entirety by reference.

BACKGROUND

1. Field

The disclosure relates to opto-electronic devices having a junction field-effect transistor structure and methods of fabricating the same, and more particularly, to quantum dot opto-electronic devices having a junction field-effect transistor structure and methods of fabricating the same.

2. Description of Related Art

Recently, image sensors with high resolution are widely used in electronic devices. As the resolution of an image sensor increases, the size of one pixel in the image sensor gradually decreases. For example, the pixel size of a high resolution image sensor used in mobile phones has become less than 1 μm. When the size of a pixel is reduced as described above, a light receiving area of a light receiving element that senses light is reduced, and also, the number of photons entering the pixel per unit time is reduced. Accordingly, a fraction of dark noise in a signal output from the light receiving element of the pixel is relatively increased and a signal-to-noise ratio is lowered, and thus, it difficult to obtain a clear image. Studies about light-receiving devices capable of reducing dark noise and improving light-receiving efficiency by improving such technical limitations have been conducted.

SUMMARY

Provided are opto-electronic devices with low dark noise and high signal-to-noise ratio.

Provided are methods of manufacturing the opto-electronic devices.

Additional aspects will be set forth in part in the description which follows and, in part, will be apparent from the description, or may be learned by practice of the presented embodiments of the disclosure.

According to an aspect of the disclosure, there is provided an opto-electronic device comprising: a semiconductor substrate; a light receiving unit formed in the semiconductor substrate; and a driving circuit arranged on a surface of the semiconductor substrate at a portion of the semiconductor substrate not overlapping the light receiving unit in a plan view, wherein the light receiving unit comprises: a first semiconductor layer arranged in an upper region of the semiconductor substrate and doped with a first conductivity type impurity; a second semiconductor layer arranged on the first semiconductor layer and doped with a second conductivity type impurity different from the first conductivity type impurity; a transparent matrix layer arranged on an upper surface of the second semiconductor layer; a plurality of quantum dots arranged to contact the transparent matrix layer; and a first electrode arranged on a first side of the transparent matrix layer and a second electrode arranged on a second side of the transparent matrix layer opposite to the first side, wherein the first electrode and the second electrode are electrically connected to the second semiconductor layer.

The first semiconductor layer may be doped to have a first doping concentration and the second semiconductor layer may be doped to have a second doping concentration less than the first doping concentration.

The plurality of quantum dots may be arranged on the upper surface of the second semiconductor layer to be in contact the upper surface of the second semiconductor layer, and the transparent matrix layer may be arranged to cover the plurality of quantum dots.

The plurality of quantum dots may be embedded inside the transparent matrix layer so as not to contact the upper surface of the second semiconductor layer.

The transparent matrix layer may comprise a transparent oxide semiconductor material.

The transparent oxide semiconductor material may comprise at least one material selected from silicon indium zinc oxide (SIZO), silicon zinc tin oxide (SZTO), indium gallium zinc oxide (IGZO), indium zinc oxide (IZO), zinc tin oxide (ZTO), $CuAlO_2$, $CuG_2O_2$, $SrCu_2O_2$, or $SnO_2$.

The driving circuit may comprise: a plurality of metal layers and a dielectric layer interposed between the plurality of metal layers.

According to another aspect of the disclosure, there is provided a method of manufacturing an opto-electronic device, the method comprising: sequentially forming, in a semiconductor substrate, a first semiconductor layer doped with a first conductivity type impurity, a second semiconductor layer doped with a second conductivity type impurity different from the first conductivity type impurity, and a first electrode and a second electrode electrically connected to the second semiconductor layer; forming a dielectric layer and a plurality of metal layers to cover an upper surface of the semiconductor substrate, an upper surface of the first semiconductor layer, and an upper surface of the second semiconductor layer; removing the dielectric layer covering the upper surface of the first semiconductor layer and the upper surface of the second semiconductor layer; and forming a plurality of quantum dots and a transparent matrix layer between the first electrode and the second electrode on the upper surface of the second semiconductor layer.

A plurality of metal layers may be embedded in a portion of the dielectric layer that does not overlap the first semiconductor layer and the second semiconductor layer in a plan view.

The forming the plurality of quantum dots and the transparent matrix layer may comprises: forming a first matrix layer on the upper surface of the second semiconductor layer; forming the plurality of quantum dots on an upper surface of the first matrix layer; and forming a second matrix layer on the first matrix layer to cover the plurality of quantum dots.

In the process of manufacturing the opto-electronic device, a first temperature of a process of forming the first semiconductor layer and the second semiconductor layer may be the highest, and a second temperature of a process of forming the quantum dots may be the lowest.

According to another aspect of the disclosure, there is provided an opto-electronic device comprising: a semiconductor substrate; a light receiving unit formed in the semiconductor substrate; and a driving circuit provided on a lower surface of the semiconductor substrate, wherein the light receiving unit comprises: a first semiconductor layer formed in a lower region of the semiconductor substrate and doped with a first conductivity type impurity; a second semiconductor layer covering the first semiconductor layer and doped with a second conductivity type impurity different from the first conductivity type impurity; a transparent matrix layer provided on the second semiconductor layer; a plurality of quantum dots arranged to contact the transparent matrix layer; and a first electrode arranged on a first side of the transparent matrix layer and a second electrode arranged on a second side of the transparent matrix layer opposite to the first side, wherein the first electrode and the second electrode are electrically connected to the second semiconductor layer in the lower region of the semiconductor substrate.

A lower surface of the first semiconductor layer may be located on a same plane as a lower surface of the semiconductor substrate, and an upper surface of the second semiconductor layer may be located on the same plane as an upper surface of the semiconductor substrate.

The transparent matrix layer or the plurality of quantum dots may directly contact the second semiconductor layer.

The light receiving unit may further comprise a third semiconductor layer arranged on both sides of the second semiconductor layer, wherein the third semiconductor layer is doped with the first conductivity type impurity.

The first semiconductor layer may be doped to have a first doping concentration, the second semiconductor layer may be doped to have a second doping concentration less than the first doping concentration, and a third doping concentration of the third semiconductor layer may be less than that of the first semiconductor layer and greater than that of the second semiconductor layer.

The light receiving unit may further comprise a third semiconductor layer doped with a first conductivity type impurity and covering the second semiconductor layer.

An upper surface of the third semiconductor layer may be located on the same plane as the upper surface of the semiconductor substrate.

The transparent matrix layer or the plurality of quantum dots may be arranged on the third semiconductor layer to directly contact the third semiconductor layer.

According to another aspect of the disclosure, there is provided a method of manufacturing an opto-electronic device, the method comprising: forming a first semiconductor layer partially formed in an upper region of a semiconductor substrate, the first semiconductor layer being doped with a first conductivity type impurity; forming a second semiconductor layer to surround side surfaces and a lower surface of the first semiconductor layer, the first semiconductor layer being doped with a second conductivity type impurity different from the first conductivity type impurity; forming a first electrode and a second electrode electrically connected to the second semiconductor layer; forming a dielectric layer and a plurality of metal layers to cover an upper surface of the semiconductor substrate, an upper surface of the first semiconductor layer, and an upper surface of the second semiconductor layer; inverting the semiconductor substrate upside down so that the dielectric layer and the plurality of metal layers face downward; partially removing the semiconductor substrate to expose the second semiconductor layer; and forming a plurality of quantum dots and a transparent matrix layer to cover an upper surface of the exposed second semiconductor layer.

According to another aspect of the disclosure, there is provided a method of manufacturing an opto-electronic device, the method comprising: forming a first semiconductor layer partially formed in an upper region of a semiconductor substrate, the first semiconductor layer being doped with a first conductivity type impurity; forming a second semiconductor layer to surround side surfaces and a lower surface of the first semiconductor layer, the first semiconductor layer being doped with a second conductivity type impurity different from the first conductivity type impurity; forming a third semiconductor layer to surround side surfaces and a lower surface of the second semiconductor layer and doped with a first conductivity type impurity; forming a first electrode and a second electrode electrically connected to the second semiconductor layer; forming a dielectric layer and a plurality of metal layers to cover an upper surface of the semiconductor substrate, an upper surface of the first semiconductor layer, an upper surface of the second semiconductor layer, and an upper surface of the third semiconductor layer; inverting the semiconductor substrate upside down so that the dielectric layer and the plurality of metal layers face downward; partially removing the semiconductor substrate to expose the third semiconductor layer or the second semiconductor layer; and forming a plurality of quantum dots and a transparent matrix layer to cover an upper surface of the exposed third semiconductor layer or second semiconductor layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
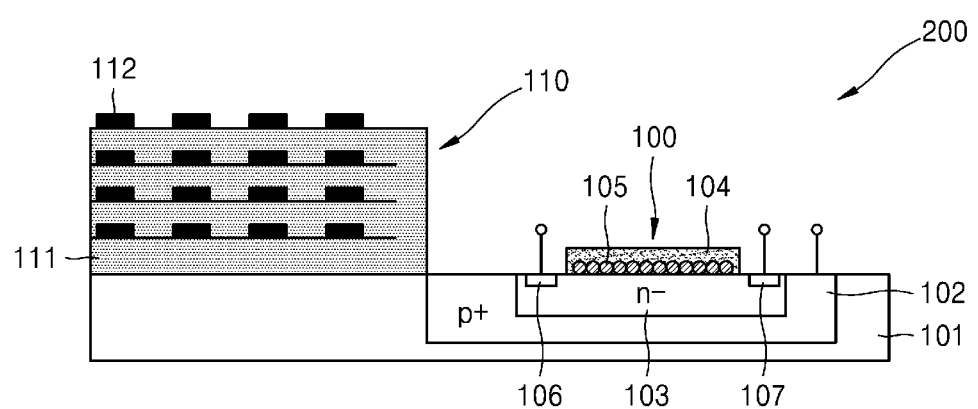
FIG. 1 is a schematic cross-sectional view showing a structure of an opto-electronic device according to an example embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, opto-electronic devices having a junction field-effect transistor structure and methods of manufacturing the same will be described in detail with reference to the accompanying drawings. In the drawings, like reference numerals refer to like elements, and sizes of each constituting element may be exaggerated for clarity of descriptions and convenience of explanation. Also, the following embodiments described below are merely illustrative, and various modifications may be possible from the embodiments of the disclosure.

It will be understood that when an element or layer is referred to as being "on" or "above" another element or layer, the element or layer may be directly on another element or layer or intervening elements or layers. Singular forms are intended to include the plural forms as well, unless the context clearly indicates otherwise. It should be understood that, when a part "comprises" or "includes" an element in the specification, unless otherwise defined, other elements are not excluded from the part and the part may further include other elements.

The term "above" and similar directional terms may be applied to both singular and plural. With respect to operations that constitute a method, the operations may be performed in any appropriate sequence unless the sequence of operations is clearly described or unless the context clearly indicates otherwise. The operations may not necessarily be performed in the order of sequence.

Also, in the specification, the term "units" or " . . . modules" denote units or modules that process at least one function or operation, and may be realized by hardware, software, or a combination of hardware and software.

Connections or connection members of lines between components shown in the drawings illustrate functional connections and/or physical or circuit connections, and the connections or connection members may be represented by replaceable or additional various functional connections, physical connections, or circuit connections in an actual device.

All examples or example terms (for example, etc.) are simply used to explain in detail the technical scope of the inventive concept, and thus, the scope of the inventive concept is not limited by the examples or the example terms as long as it is not defined by the claims.

FIG. 1 is a schematic cross-sectional view showing a structure of an opto-electronic device 200 according to an example embodiment. Referring to FIG. 1, the opto-electronic device 200 according to an example embodiment may include a semiconductor substrate 101, a light receiving unit 100 formed in the semiconductor substrate 101, and a driving circuit 110 arranged on an upper surface of the semiconductor substrate 101 on which the light receiving unit 100 is not formed. For example, the semiconductor substrate 101 may include silicon Si, germanium Ge, or a compound semiconductor material.

The light receiving unit 100 receives light and generates a photocurrent. To this end, the light receiving unit 100 may include a first semiconductor layer 102 partially formed in an upper region of the semiconductor substrate 101, a second semiconductor layer 103 partially formed in an upper region of the first semiconductor layer 102, a transparent matrix layer 104 arranged on an upper surface of the second semiconductor layer 103, a plurality of quantum dots 105 arranged to contact the transparent matrix layer 104, and a first electrode 106 and a second electrode 107 respectively arranged on both sides of the transparent matrix layer 104. In FIG. 1, it is depicted that the semiconductor substrate 101 is illustrated as surrounding a lower surface and side surfaces of the first semiconductor layer 102 and the first semiconductor layer 102 is illustrated as surrounding a lower surface and side surfaces of the second semiconductor layer 103, but the disclosure is not limited thereto. For example, according to another example embodiment, the first semiconductor layer 102 may be formed to contact only the lower surface of the second semiconductor layer 103. In this case, the side surfaces of the second semiconductor layer 103 may contact the semiconductor substrate 101. In either case, the first semiconductor layer 102 is arranged on the upper surface of the semiconductor substrate 101, and the second semiconductor layer 103 is arranged on the upper surface of the first semiconductor layer 102.

The first semiconductor layer 102 may be formed by doping an upper region of the semiconductor substrate 101 to a first conductivity type at a high concentration. Also, the second semiconductor layer 103 may be formed by doping an upper region of the first semiconductor layer 102 to a second conductivity type at a low concentration, wherein the second conductivity type is electrically opposite to the first conductivity type. For example, in FIG. 1, it is depicted that the first semiconductor layer 102 is a p+ semiconductor doped with a p-type impurity at a high concentration, and the second semiconductor layer 103 is an n− semiconductor doped with an n-type impurity. However, this is only an example and the disclosure is not limited thereto. Instead, according to another example embodiment, it is also possible that the first semiconductor layer 102 is an n+ semiconductor and the second semiconductor layer 103 is a p− semiconductor. The second semiconductor layer 103 may include a semiconductor material of the same type as the first semiconductor layer 102, but is doped with a conductivity type impurity electrically opposite to that of the first semiconductor layer 102. Accordingly, the first semiconductor layer 102 and the second semiconductor layer 103 form a pn junction.

The first electrode 106 and the second electrode 107 may be arranged on the upper surface of the second semiconductor layer 103 to be electrically connected to the second semiconductor layer 103. In FIG. 1, it is depicted that the first electrode 106 and the second electrode 107 are arranged inside the upper surface of the second semiconductor layer 103, and thus, upper surfaces of the first electrode 106 and the second electrode 107 are exposed to the outside, and side surfaces and bottom surfaces of the first electrode 106 and the second electrode 107 are surrounded by the second semiconductor layer 103. In this case, the upper surface of the first electrode 106 and the upper surface of the second electrode 107 may be coplanar with the upper surface of the second semiconductor layer 103. However, this is only an example and the disclosure not necessarily limited thereto. For example, according to another example embodiment, the first electrode 106 and the second electrode 107 may be arranged to protrude over the upper surface of the second semiconductor layer 103. In this case, the upper surface of the second semiconductor layer 103 is a flat surface, and the bottom surface of the first electrode 106 and the bottom surface of the second electrode 107 may be flush with the upper surface of the second semiconductor layer 103.

In this structure, the first semiconductor layer 102 performs as a gate and the second semiconductor layer 103 performs as a channel. Also, the first electrode 106 and the second electrode 107 perform as a source electrode and a drain electrode. An additional gate insulating layer is not disposed between the first semiconductor layer 102 that performs as a gate and the second semiconductor layer 103 that performs as a channel. Accordingly, the light receiving unit 100 has a structure of a junction field-effect transistor (JFET).

When the first semiconductor layer 102 that performs as a gate is doped with a p-type impurity and the second semiconductor layer 103 that performs as a channel is doped with an n-type impurity, a current flows between the first electrode 106 and the second electrode 107 through the second semiconductor layer 103 while a gate voltage is not applied to the first semiconductor layer 102. However, when a reverse voltage, that is, a negative voltage is applied to the first semiconductor layer 102, a depletion region in the second semiconductor layer 103 is widened and a current flowing between the first electrode 106 and the second electrode decreases. Then, when a reverse voltage of a predetermined intensity or more is applied to the first semiconductor layer 102, the second semiconductor layer 103 is filled with a depletion region, and thus, a current will not flow between the first electrode 106 and the second electrode 107. Accordingly, the light receiving unit 100 is in an ON state when no voltage is applied to the first semiconductor layer 102 and is in an OFF state when a reverse voltage equal to or greater than a threshold voltage is applied to the first semiconductor layer 102.

The transparent matrix layer 104 and the plurality of quantum dots 105 are disposed between the first electrode 106 and the second electrode 107. The first electrode 106 and the second electrode 107 may directly contact the transparent matrix layer 104 and the plurality of quantum dots 105 disposed therebetween, or may be separated from the transparent matrix layer 104 and the plurality of quantum dots 105 so as not to directly contact the transparent matrix layer 104 and the plurality of quantum dots 105.

The transparent matrix layer 104 and the plurality of quantum dots 105 amplify a photocurrent generated by photons incident on the light receiving unit 100. Each of the plurality of quantum dot 105 is a particle of a predetermined size having a quantum confinement effect. The quantum dot 105 may include a compound, such as CdSe, CdSe, CdTe, InP, InAs, InSb, PbSe, PbS, PbTe, AlAs, ZnS, ZnSe, ZnTe, etc. When light enters the quantum dot 105, the quantum dot 105 absorbs light and generates a photocarrier, that is, a pair of movable electrons and holes. When the photocarrier generated in the quantum dot 105 moves to the second semiconductor layer 103 that performs as a channel through the transparent matrix layer 104, a photocurrent flows between the first electrode 106 and the second electrode 107. For example, when the second semiconductor layer 103 that performs as a channel is an n-type, electrons as a photocarrier may move to the second semiconductor layer 103. Conversely, when the second semiconductor layer 103 is a p-type, holes as a photocarrier may be moved to the second semiconductor layer 103.

A wavelength of light absorbed by the quantum dot 105 may vary according to a band gap of the quantum dot 105. The band gap of the quantum dot 105 may be mainly determined by a diameter of the quantum dot 105. For example, the quantum dot 105 may have a diameter in a range of about 1 nm to about 10 nm. Accordingly, the diameter of the quantum dot 105 may be changed according to a wavelength of light to be detected by the light receiving unit 100. If the light receiving unit 100 is configured to sense light in a wide wavelength band, the plurality of quantum dots 105 may have various diameters. Also, if the light receiving unit 100 is configured to sense light in a specific wavelength band, the plurality of quantum dots 105 may have the same diameter.

The transparent matrix layer 104 may efficiently transfer a photocarrier generated from the quantum dots 105 to the second semiconductor layer 103. In particular, the transparent matrix layer 104 efficiently separates electrons and holes generated in the quantum dots 105 and transfers the separated electrons or holes to the second semiconductor layer 103. To this end, the transparent matrix layer 104 is arranged to contact each of the plurality of quantum dots 105. In addition, the transparent matrix layer 104 may include a material that is transparent to a wavelength band of light to be sensed by the light receiving unit 100 so that incident light is transmitted to the quantum dot 105. The transparent matrix layer 104 may include a transparent oxide semiconductor material. For example, the transparent matrix layer 104 may include a transparent oxide semiconductor material, such as silicon indium zinc oxide (SIZO), silicon zinc tin oxide (SZTO), indium gallium zinc oxide (IGZO), indium zinc oxide (IZO), zinc tin oxide (ZTO), $CuAlO_2$, $CuG_2O_2$, $SrCu_2O_2$, $SnO_2$ etc.

The transparent matrix layer 104 may be formed in a small thickness. For example, the transparent matrix layer 104 may have a thickness in a range of about 1 nm to about 100 nm. Alternatively, the transparent matrix layer 104 may have a thickness in a range of about 1 nm to about 50 nm. Alternatively, the transparent matrix layer 104 may have a thickness in a range of about 1 nm to about 30 nm. Since the transparent matrix layer 104 has a small thickness, the opto-electronic device 200 may have a sufficiently small thickness.

The driving circuit 110 may output a photocurrent generated in the light receiving unit 100 as an electrical signal. The driving circuit 110 may be configured to turn ON/OFF the light receiving unit 100 or output a signal from the light receiving unit 100 as necessary. To this end, the driving circuit 110 may include a plurality of thin film transistors, capacitors, electrodes, electrode pads, and wirings. The plurality of thin film transistors, capacitors, electrodes, electrode pads, and wirings may be arranged in a plurality of layers. In addition, an interlayer insulating layer may be interposed between layers in which a plurality of thin film transistors, capacitors, electrodes, electrode pads, and wirings are arranged. In FIG. 1, for convenience, it is simply depicted that the driving circuit 110 includes a plurality of metal layers 112 arranged along a plurality of layers and a dielectric layer 111 interposed between the plurality of metal layers 112. The driving circuit 110 may be arranged on an upper surface of the semiconductor substrate 101 at a side of the light receiving unit 100 so as not to block light incident on the light receiving unit 100.

In the case of the photoelectric device 200 having the structure of the above-described junction field-effect transistor, an area of a depletion region in the second semiconductor layer 103 is controlled by controlling a voltage applied to the first semiconductor layer 102 through the driving circuit 110, and thus, a current flowing between the first electrode 106 and the second electrode 107 through the second semiconductor layer 103 may be controlled. Accordingly, even when no light is incident on the light receiving unit 100, dark noise generated by a current flowing between the first electrode 106 and the second electrode 107 may be suppressed or reduced. Therefore, a signal-to-noise ratio of the opto-electronic device 200 according to the example embodiment may be improved.

In addition, the light receiving unit 100 may be easily turned ON/OFF by controlling a voltage applied to the first semiconductor layer 102 through the driving circuit 110, and thus, a switching operation for outputting a photocurrent from the light receiving unit 100 is possible by turning on the light receiving unit only when a signal output is required.

In addition, since the transparent matrix layer 104 and the plurality of quantum dots 105 arranged on the second semiconductor layer 103 that performs as a channel are used, more photocarriers are generated than photons incident on the light receiving unit 100 per unit time, and thus, the opto-electronic device 200 has a gain greater than 1. Therefore, a signal-to-noise ratio of the opto-electronic device 200 may be further improved because of the amplification effect of an output signal due to the transparent matrix layer 104 and the plurality of quantum dots 105. Accordingly, when the opto-electronic device 200 according to the example embodiment is used, a clear image may be obtained even in weak incident light. Accordingly, it is possible to further reduce the size of pixels of an image sensor including the opto-electronic element 200, and thus, the resolution of the image sensor may further be increased.

FIGS. 2A to 2D are schematic cross-sectional views showing a process of manufacturing the opto-electronic device 200 shown in FIG. 1.

Figure 2A:
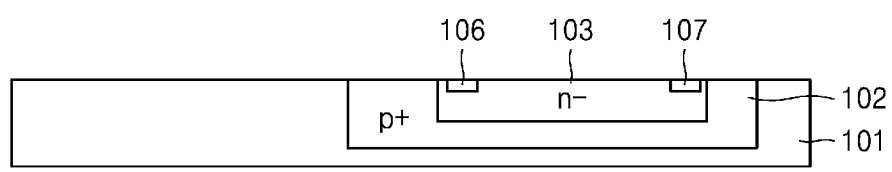
FIGS. 2A to 2D are schematic cross-sectional views showing a process of manufacturing the opto-electronic device of FIG. 1.

First, referring to FIG. 2A, the first semiconductor layer 102, the second semiconductor layer 103, and the first electrode 106 and the second electrode 107 are sequentially formed on the semiconductor substrate 101. The first semiconductor layer 102 may be formed, for example, by partially doping an upper region of the semiconductor substrate 101 by using an ion implantation method, etc. Also, the second semiconductor layer 103 may be formed by partially doping an upper region of the first semiconductor layer 102 by using an ion implantation method, etc. For example, the first semiconductor layer 102 is formed by doping the upper region of the semiconductor substrate 101 with p+, and the second semiconductor layer 103 is formed by doping the upper region of the first semiconductor layer 102 with n−. Instead, the first semiconductor layer 102 may be formed by doping the upper region of the semiconductor substrate 101 with n+, and the second semiconductor layer 103 may be formed by doping the upper region of the first semiconductor layer 102 with p−. Afterwards, the first electrode 106 and the second electrode 107 may be formed by partially etching an upper surface of the second semiconductor layer 103 and depositing a metal material.

Figure 2B:
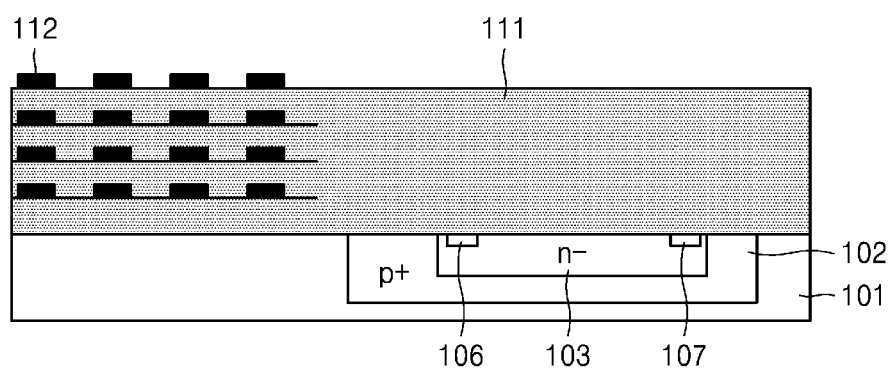

Next, referring to FIG. 2B, the dielectric layer 111 and the plurality of metal layers 112 are formed to cover an upper surface of the semiconductor substrate 101, an upper surface of the first semiconductor layer 102, and an upper surface of the second semiconductor layer 103. The metal layers 112 may be formed only on the upper surface of the semiconductor substrate 101 without the first semiconductor layer 102 and the second semiconductor layer 103. For example, after partially forming the dielectric layer 111, one metal layer 112 may be formed on the dielectric layer 111, and another dielectric layer 111 may be partially formed to cover one metal layer 112 again. The dielectric layer 111 may be formed by depositing, for example, $SiO_2$ and the metal layer 112 may be formed by using a sputtering method. The plurality of metal layers 112 may be formed by repeating this process multiple times. The plurality of metal layers 112 may constitute a thin film transistor, a capacitor, an electrode, an electrode pad, and a wiring.

Figure 2C:
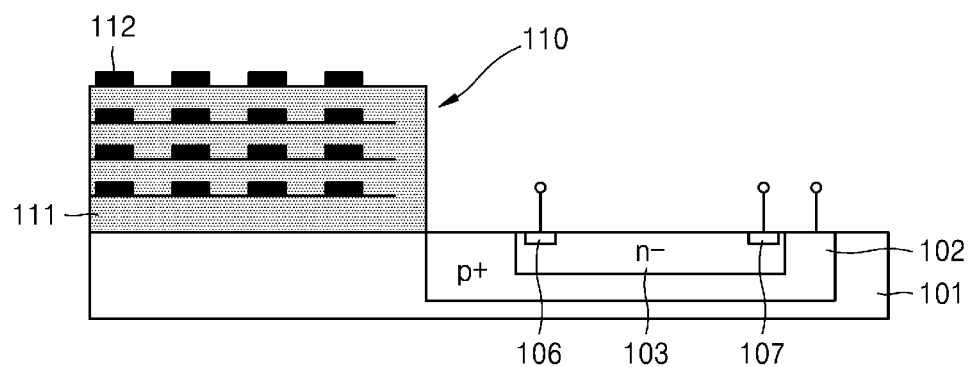

Referring to FIG. 2C, the driving circuit 110 is formed by partially etching and removing the dielectric layer 111 covering the upper surface of the first semiconductor layer 102 and the upper surface of the second semiconductor layer 103. Accordingly, the driving circuit 110 is arranged only on the upper surface of the semiconductor substrate 101 where the first semiconductor layer 102 and the second semiconductor layer 103 are not formed.

Figure 2D:
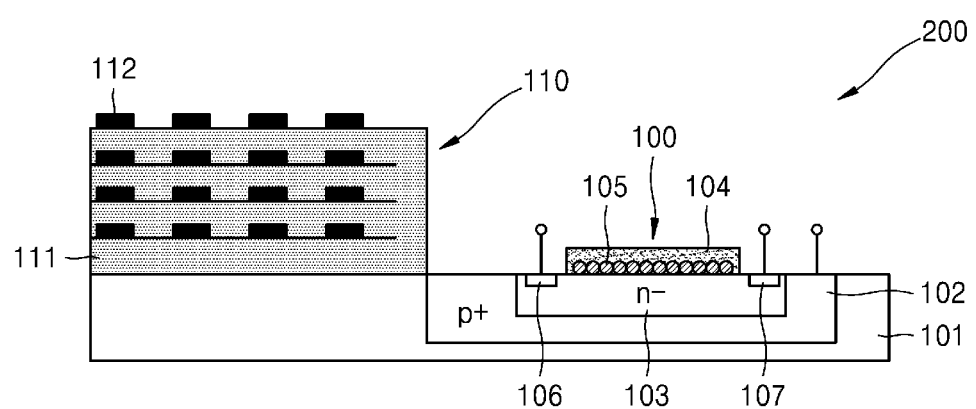

Referring to FIG. 2D, the plurality of quantum dots 105 and the transparent matrix layer 104 are formed between the first electrode 106 and the second electrode 107 on the upper surface of the second semiconductor layer 103, and thus, the forming of the light receiving unit 100 is completed. The plurality of quantum dots 105 may be coated on the upper surface of the second semiconductor layer 103 by using, for example, a spin coating method, a printing method, or an inkjet method. Then, the transparent matrix layer 104 may be formed to cover the plurality of quantum dots 105. The transparent matrix layer 104 including a transparent oxide semiconductor may be formed by, for example, chemical vapor deposition (CVD), radio frequency magnetron sputtering (RF), or pulsed laser deposition (PLD).

According to the method of manufacturing the opto-electronic device 200 shown in FIGS. 2A to 2D, a semiconductor process requiring a high temperature of 600° C. or higher, that is, a process of forming the first semiconductor layer 102 and the second semiconductor layer 103 is performed first. Subsequently, a process of forming the plurality of metal layers 112 that is performed at a temperature of about 400° C. is performed. A process of forming the plurality of quantum dots 105 is finally performed. The plurality of quantum dots 105 may be formed at a temperature of, for example, about 150° C. Accordingly, the temperature of the semiconductor process is the highest, the temperature of the process of forming the plurality of metal layers 112 is next highest, and the temperature of the process of forming the plurality of quantum dots 105 is the lowest. As such, since the plurality of quantum dots 105 are formed after all the high temperature processes are performed, there is no risk of damage to the plurality of quantum dots 105 by high temperature.

Figure 3:
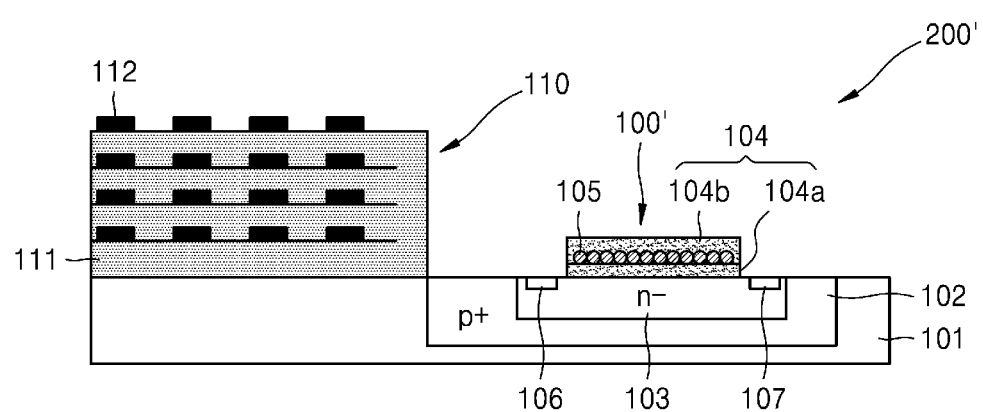
FIG. 3 is a schematic cross-sectional view showing a structure of an opto-electronic device according to another example embodiment.

In the example embodiment illustrated in FIG. 1, it is depicted that the plurality of quantum dots 105 of the light-receiving unit 100 are in direct contact with the upper surface of the second semiconductor layer 103. However, the example embodiment is not necessarily limited thereto. For example, FIG. 3 is a schematic cross-sectional view showing a structure of an opto-electronic device 200' according to another example embodiment. Referring to FIG. 3, a transparent matrix layer 104 of a light receiving unit 100' of the photoelectric device 200' includes a first matrix layer 104a arranged to contact an upper surface of a second semiconductor layer 103 and a second matrix layer 104b arranged on an upper surface of the first matrix layer 104a The plurality of quantum dots 105 may be arranged between the first matrix layer 104a and the second matrix layer 104b. For example, in the process illustrated in FIG. 2D, after first forming the first matrix layer 104a on the upper surface of the second semiconductor layer 103, the plurality of quantum dots 105 may be formed on the upper surface of the first matrix layer 104a, and the second matrix layer 104b may be formed on the first matrix layer 104a to cover the plurality of quantum dots 105.

In the example embodiment shown in FIG. 3, the plurality of quantum dots 105 are embedded inside the transparent matrix layer 104. Therefore, an entire surface of each of the plurality of quantum dots 105 is completely surrounded by the transparent matrix layer 104. Also, each of the plurality of quantum dots 105 does not contact the second semiconductor layer 103. Then, an area of an interface between the transparent matrix layer 104 and the plurality of quantum dots 105 is increased, and thus, a charge separation rate may be increased. The increase in the charge separation rate may denote that the charge separation efficiency is increased. If the charge separation efficiency is increased, the light receiving unit 100' may have high sensitivity.

Figure 4:
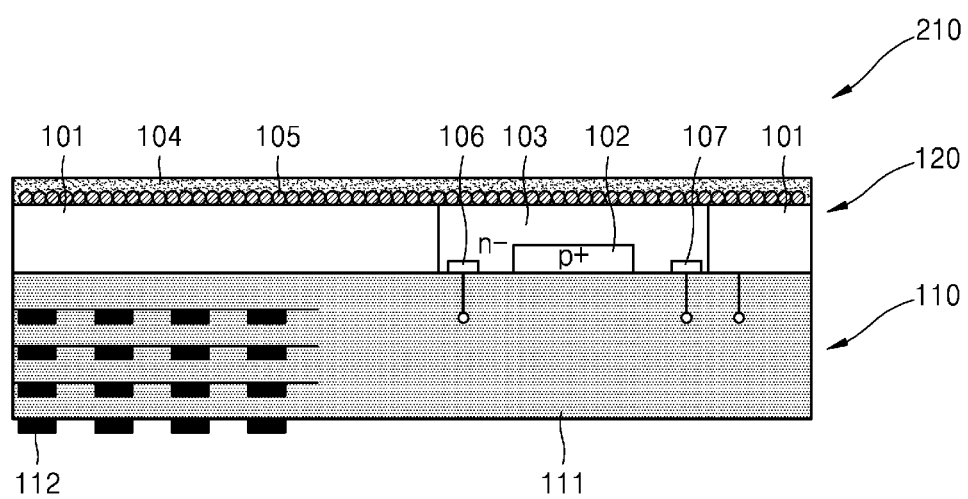
FIG. 4 is a schematic cross-sectional view showing a structure of an opto-electronic device according to another example embodiment.

In the example embodiment shown in FIGS. 1 and 3, the driving circuit 110 is arranged on the upper surface of the semiconductor substrate 101, but is not necessarily limited thereto. For example, in FIG. 4, a schematic cross-sectional view of a structure of an opto-electronic device 210 according to another example embodiment is shown. Referring to FIG. 4, the opto-electronic device 210 includes a semiconductor substrate 101, a light receiving unit 120 formed in the semiconductor substrate 101, and a driving circuit 110 disposed on a lower surface of the semiconductor substrate 101.

The light receiving unit 120 may include a first semiconductor layer 102 formed in a lower region of a semiconductor substrate 101; a second semiconductor layer 103 covering the first semiconductor layer 102 and exposed to an upper surface of the semiconductor substrate 101; a first electrode 106 and a second electrode 107 respectively formed on both sides of the first semiconductor layer 102 so as to be electrically connected to the second semiconductor layer 103 in a lower region of the semiconductor substrate 101; a transparent matrix layer 104 arranged on an upper surface of the semiconductor substrate 101 and an upper surface of the second semiconductor layer 103; and a plurality of quantum dots 105 arranged to contact the transparent matrix layer 104. The transparent matrix layer 104 may be arranged to cover the second semiconductor layer 103 exposed to the upper surface of the semiconductor substrate 101.

A lower surface of the first semiconductor layer 102 may be located on the same plane as a lower surface of the semiconductor substrate 101. A lower surface of the first electrode 106 and a lower surface of the second electrode 107 may also be located on the same plane as the lower surface of the semiconductor substrate 101. The second semiconductor layer 103 may be arranged to surround side and upper surfaces of the first semiconductor layer 102, side and upper surfaces of the first electrode 106, and side and upper surfaces of the second electrode 107. In addition, the upper surface of the second semiconductor layer 103 is located on the same plane as the upper surface of the semiconductor substrate 101.

In the example embodiment illustrated in FIG. 4, since areas of the transparent matrix layer 104 and the plurality of quantum dots 105 are increased, the sensitivity of the light receiving unit 120 may be increased. In addition, in the example embodiment illustrated in FIG. 4, the plurality of quantum dots 105 are illustrated as directly contacting the upper surfaces of the semiconductor substrate 101 and the second semiconductor layer 103, but are not limited thereto. For example, as shown in FIG. 3, the plurality of quantum dots 105 may be completely surrounded by the transparent matrix layer 104. In this case, the transparent matrix layer 104 may be arranged to contact the upper surfaces of the semiconductor substrate 101 and the second semiconductor layer 103.

FIGS. 5A to 5E are schematic cross-sectional views showing a process of manufacturing the opto-electronic device 210 shown in FIG. 4.

Figure 5A:
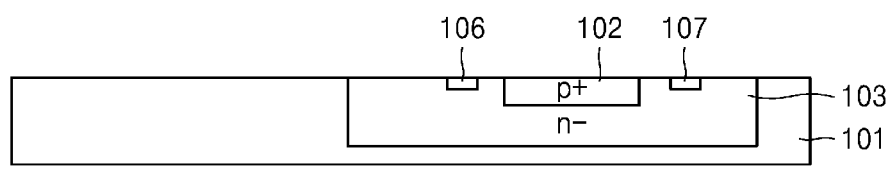
FIGS. 5A to 5E are schematic cross-sectional views showing a process of manufacturing the opto-electronic device of FIG. 4.

First, referring to FIG. 5A, the second semiconductor layer 103, the first semiconductor layer 102, and the first electrode 106 and the second electrode 107 are sequentially formed on the semiconductor substrate 101. Unlike the example embodiment illustrated in FIG. 2A, in the example embodiment illustrated in FIG. 5A, the second semiconductor layer 103 may be formed before forming the first semiconductor layer 102. The second semiconductor layer 103 may be formed by partially doping an upper region of the semiconductor substrate 101 by using, for example, an ion implantation method, etc. Also, the first semiconductor layer 102 may be formed by partially doping an upper region of the second semiconductor layer 103 by using an ion implantation method, etc. Accordingly, the first semiconductor layer 102 is partially formed in the upper region of the semiconductor substrate 101. In addition, the second semiconductor layer 103 is formed to surround side surfaces and a lower surface of the first semiconductor layer 102. As described above, the first semiconductor layer 102 and the second semiconductor layer 103 may be doped with electrically opposite conductivity type impurities. The first electrode 106 and the second electrode 107 may be formed by partially etching the upper surface of the second semiconductor layer 103 and depositing a metal material.

Figure 5B:
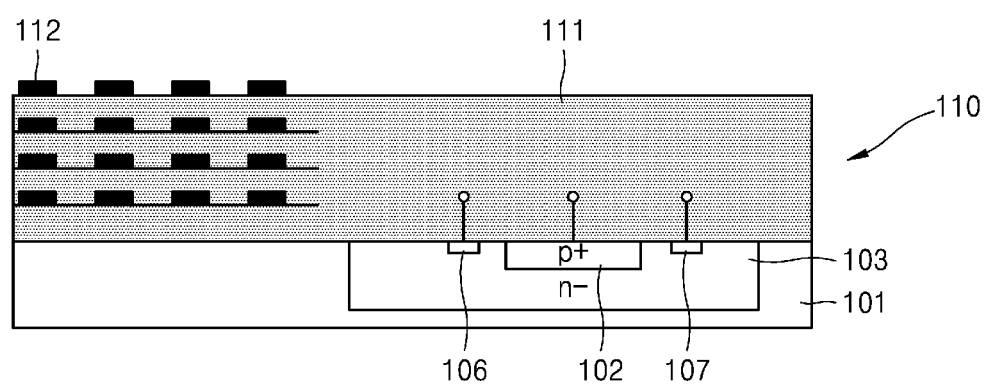

Referring to FIG. 5B, a driving circuit 110 may be formed on the upper surface of the semiconductor substrate 101, the upper surface of the second semiconductor layer 103, the upper surface of the first electrode 106, and the upper surface of the second electrode 107. As described with reference to FIG. 2B, the driving circuit 110 may be formed by repeatedly stacking and forming the dielectric layer 111 and the metal layer 112.

Figure 5C:
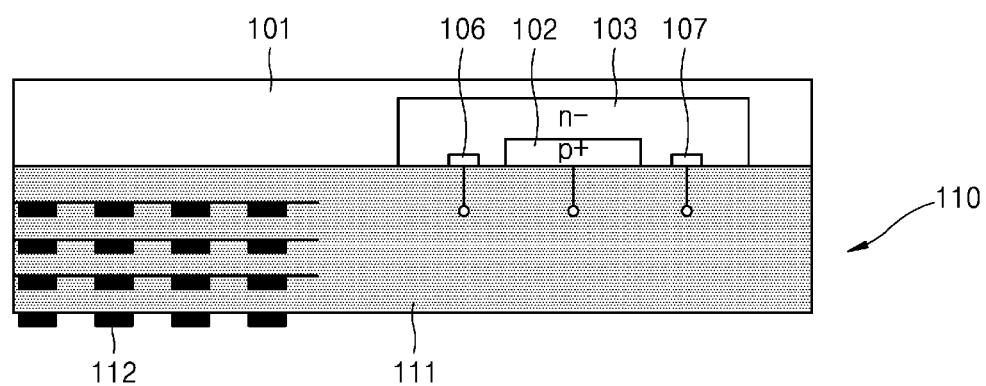

Referring to FIG. 5C, the semiconductor substrate 101 is inverted upside down in a state that the dielectric layer 111 of the driving circuit 110 is not partially removed and maintained as it is. Then, the upper and lower portions of the semiconductor substrate 101 are reversed. For example, the upper surfaces of the semiconductor substrate 101, the first semiconductor layer 102, the second semiconductor layer 103, the first electrode 106, and the second electrode 107 described with reference to FIGS. 5A and 5B become lower surfaces in FIG. 5C. In addition, the lower surfaces of the semiconductor substrate 101, the first semiconductor layer 102, the second semiconductor layer 103, the first electrode 106, and the second electrode 107 described with reference to FIGS. 5A and 5B become upper surfaces.

Figure 5D:
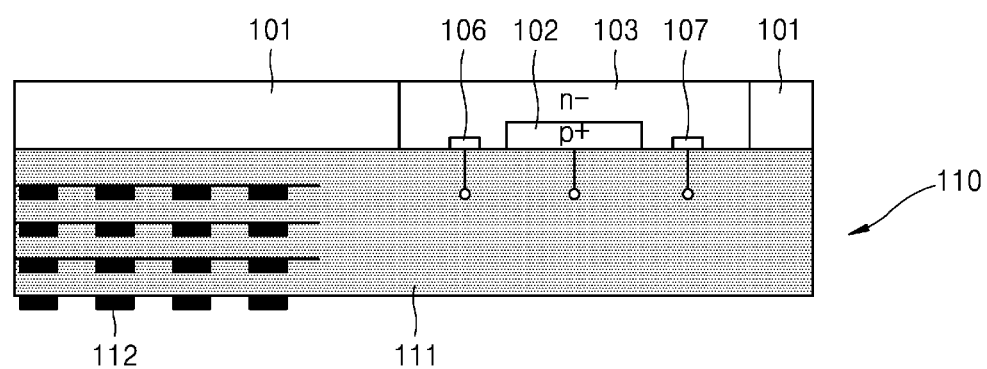

Afterwards, referring to FIG. 5D, an upper region of the semiconductor substrate 101 is partially removed through a polishing process until the second semiconductor layer 103 is exposed. The upper surface of the semiconductor substrate 101 may be polished as a whole so that the exposed upper surface of the second semiconductor layer 103 and the remaining region of the semiconductor substrate 101 maintain a flat plane.

Figure 5E:
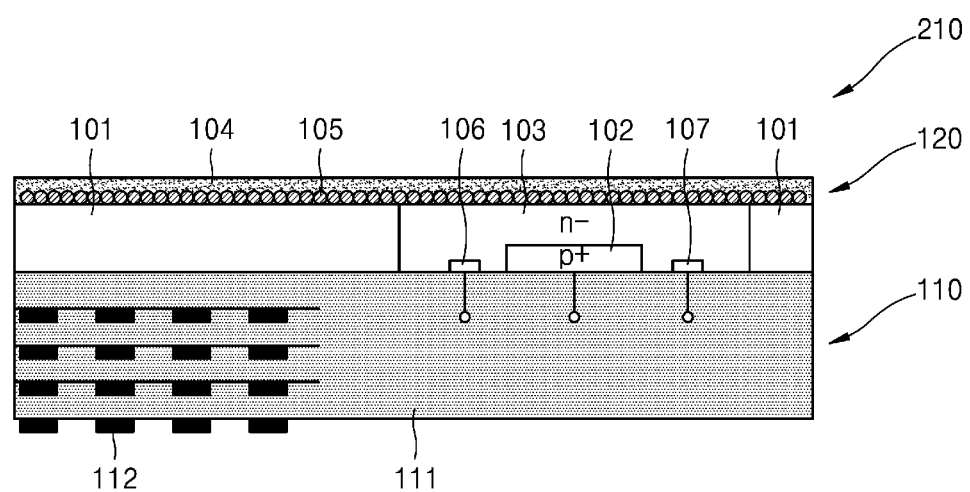

Finally, referring to FIG. 5E, a transparent matrix layer 104 and a plurality of quantum dots 105 are formed to cover the upper surface of the exposed second semiconductor layer 103. Here, the positions of the transparent matrix layer 104 and the plurality of quantum dots 105 are not limited between the first electrode 106 and the second electrode 107. For example, the transparent matrix layer 104 and the plurality of quantum dots 105 may be formed on the upper surface of the second semiconductor layer 103. Alternatively, the transparent matrix layer 104 and the plurality of quantum dots 105 may be formed to cover both the upper surface of the semiconductor substrate 101 and the upper surface of the second semiconductor layer 103. For example, after forming a plurality of quantum dots 105 on the upper surface of the semiconductor substrate 101 and the upper surface of the second semiconductor layer 103, the transparent matrix layer 104 may be formed to cover the plurality of quantum dots 105. Alternatively, the transparent matrix layer 104 is first formed on the upper surface of the semiconductor substrate 101 and the upper surface of the second semiconductor layer 103, a plurality of quantum dots 105 are formed thereon, and then, the transparent matrix layer 104 may further be formed to cover the plurality of quantum dots 105.

Figure 6:
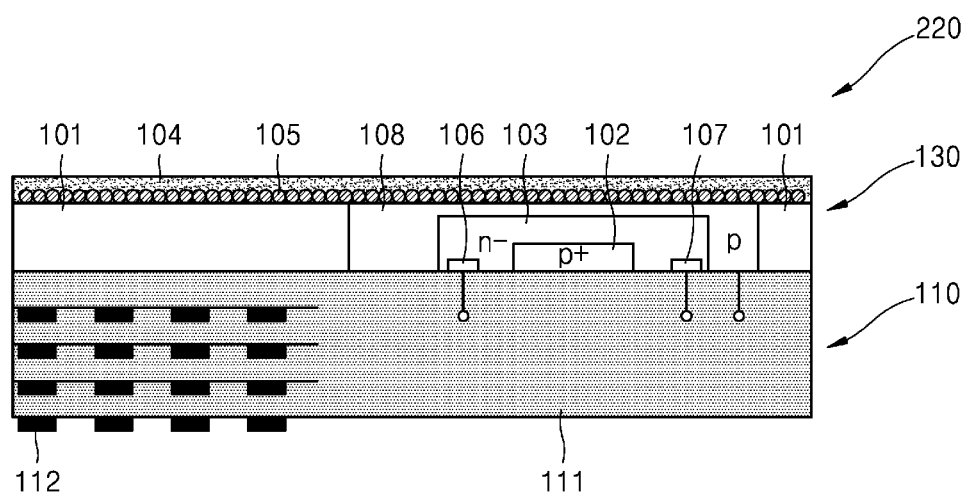
FIG. 6 is a schematic cross-sectional view showing a structure of an opto-electronic device according to another example embodiment.

FIG. 6 is a schematic cross-sectional view showing a structure of an opto-electronic device 220 according to another example embodiment. Referring to FIG. 6, the opto-electronic device 220 includes a semiconductor substrate 101, a light receiving unit 130 formed in the semiconductor substrate 101, and a driving circuit 110 arranged on a lower surface of the semiconductor substrate 101.

The light receiving unit 130 may include a first semiconductor layer 102 formed in a lower region of the semiconductor substrate 101, a second semiconductor layer 103 formed to cover the first semiconductor layer 102, a third semiconductor layer 108 covering the second semiconductor layer 103 and formed to be exposed to an upper surface of the semiconductor substrate 101, a first and second electrodes 106 and 107 respectively formed on both sides of the first semiconductor layer 102 to be electrically connected to the second semiconductor layer 103 in a lower region of the semiconductor substrate 101, a transparent matrix layer 104 arranged on the upper surface of the semiconductor substrate 101 and an upper surface of the third semiconductor layer 108, and a plurality of quantum dots 105 arranged to contact the transparent matrix layer 104. The second semiconductor layer 103 is formed to surround side and upper surfaces of the first semiconductor layer 102, and the third semiconductor layer 108 is formed to surround side and upper surfaces of the second semiconductor layer 103. In this case, the upper surface of the third semiconductor layer 108 may be flush with the upper surface of the semiconductor substrate 101.

The first semiconductor layer 102 and the second semiconductor layer 103 have the same configuration as described above. The third semiconductor layer 108 efficiently transfers a photocarrier generated from the quantum dots 105 to the second semiconductor layer 103 together with the transparent matrix layer 104. Also, the third semiconductor layer 108 may serve as an additional gate. To this end, the transparent matrix layer 104 or a plurality of quantum dots 105 may be arranged on the third semiconductor layer 108 to directly contact the third semiconductor layer 108.

Also, the third semiconductor layer 108 may have the same conductivity type as the first semiconductor layer 102 and may have a conductivity type that is electrically opposite to the second semiconductor layer 103. A doping concentration of the third semiconductor layer 108 may be less than that of the first semiconductor layer 102 and may be greater than that of the second semiconductor layer 103. For example, when the second semiconductor layer 103 is an n– semiconductor, the third semiconductor layer 108 is a p semiconductor, and when the second semiconductor layer 103 is a p– semiconductor, the third semiconductor layer 108 is an n semiconductor.

In this case, the light receiving unit 130 may have a structure of a double gate junction field-effect transistor (JFET) in which gates are respectively arranged on upper and lower sides of the second semiconductor layer 103 that performs as a channel. Since gates are respectively arranged on the lower and upper sides of the second semiconductor layer 103 that performs as a channel layer, a depletion region may be controlled at the lower and upper sides of the channel layer, and thus, dark noise may be more easily reduced or suppressed.

FIGS. 7A to 7E are schematic cross-sectional views showing a process of manufacturing the opto-electronic device 220 shown in FIG. 6.

Figure 7A:
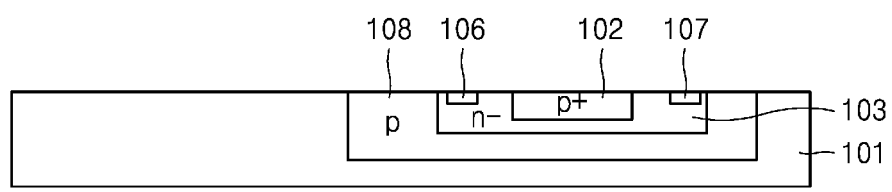
FIGS. 7A to 7E are schematic cross-sectional views showing a process of manufacturing the opto-electronic device of FIG. 6.

First, referring to FIG. 7A, the third semiconductor layer 108, the second semiconductor layer 103, the first semiconductor layer 102, and the first electrode 106 and a second electrode 107 are sequentially formed on the semiconductor substrate 101. The third semiconductor layer 108 may be formed by partially doping an upper region of the semiconductor substrate 101 by using an ion implantation method, etc. The second semiconductor layer 103 may be formed by partially doping an upper region of the third semiconductor layer 108. Also, the first semiconductor layer 102 may be formed by partially doping an upper region of the second semiconductor layer 103. Accordingly, the first semiconductor layer 102 is partially formed in the upper region of the semiconductor substrate 101, and the second semiconductor layer 103 is formed to surround side surfaces and a lower surface of the first semiconductor layer 102, and the third semiconductor layer 108 is formed to surround side surfaces and a lower surface of the second semiconductor layer 103. The third semiconductor layer 108 and the second semiconductor layer 103 are electrically doped with opposite conductivity type impurities, and the third semiconductor layer 108 and the first semiconductor layer 102 are electrically doped with the same conductivity type impurity. Then, the first electrode 106 and the second electrode 107 may be formed by partially etching an upper surface of the second semiconductor layer 103 and depositing a metal material.

Figure 7B:
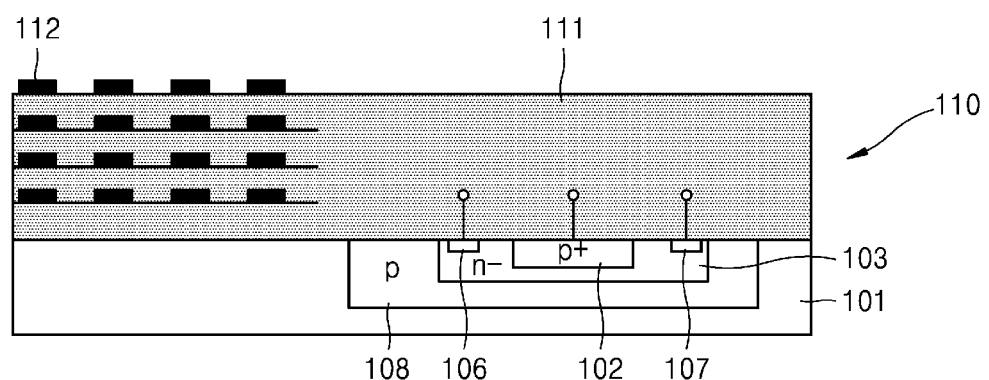

Referring to FIG. 7B, a driving circuit 110 may be formed on an upper surface of the semiconductor substrate 101, an upper surface of the third semiconductor layer 108, an upper surface of the second semiconductor layer 103, an upper surface of the first electrode 106, and an upper surface of the second electrode 107. A process of forming the driving circuit 110 may be the same as the process described with reference to FIG. 5B.

Figure 7C:
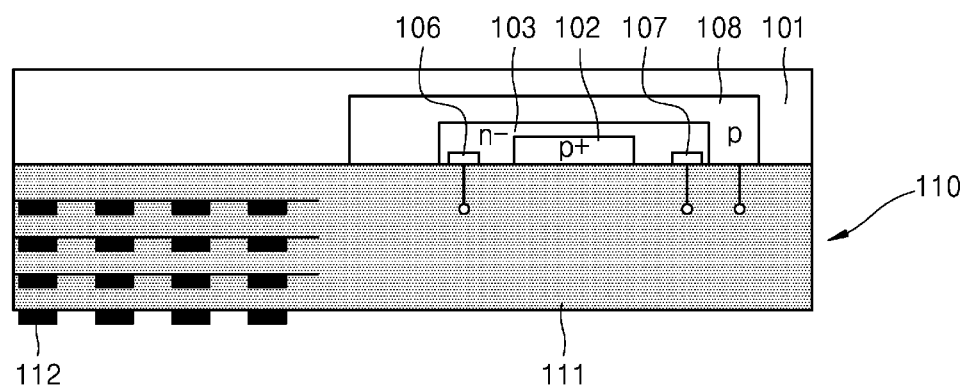

Referring to FIG. 7C, the structure formed in FIG. 7B is inverted upside down while the dielectric layer 111 of the driving circuit 110 is maintained without being removed. Then, the upper and lower sides of the structure are inverted.

Figure 7D:
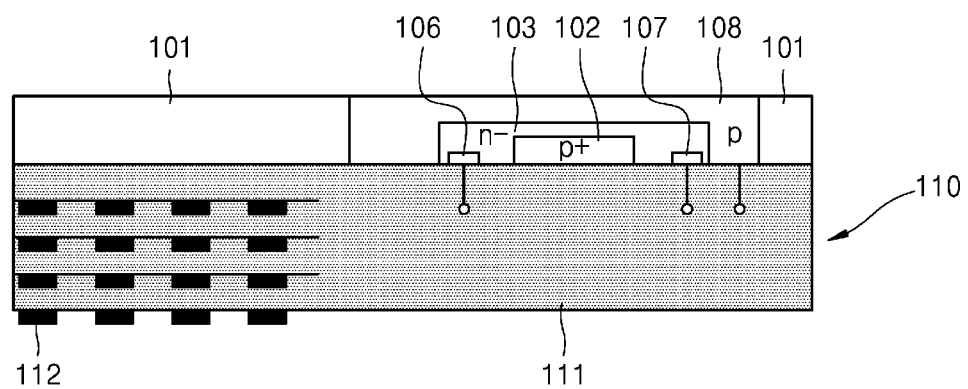

Referring to FIG. 7D, the upper surface of the semiconductor substrate 101 is removed through a polishing process until the third semiconductor layer 108 is exposed. For example, the upper surface of the semiconductor substrate 101 may be entirely flat polished so that the exposed upper surface of the third semiconductor layer 108 and the remaining area of the semiconductor substrate 101 form a flat plane. If the thickness of the third semiconductor layer 108 is excessively large, a loss of photocarrier may occur while the photocarrier moves to the second semiconductor layer 103 through the third semiconductor layer 108. Accordingly, even after the third semiconductor layer 108 is exposed, the thickness of the third semiconductor layer 108 may further be reduced by performing the polishing.

Figure 7E:
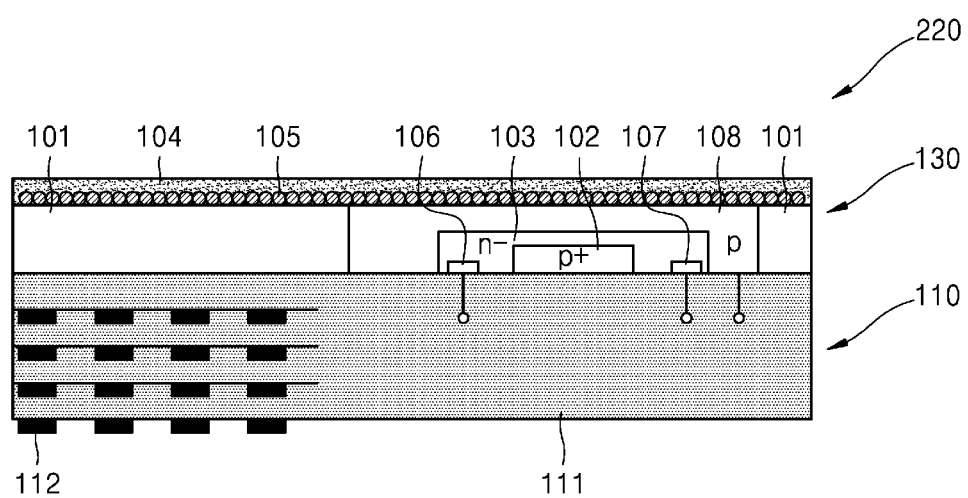

In addition, referring to FIG. 7E, the transparent matrix layer 104 and the plurality of quantum dots 105 are formed to cover the exposed upper surface of the third semiconductor layer 108. Here, the positions of the transparent matrix layer 104 and the plurality of quantum dots 105 are not limited between the first electrode 106 and the second electrode 107. For example, the transparent matrix layer 104 and the plurality of quantum dots 105 may be formed on the upper surface of the third semiconductor layer 108. Alternatively, the transparent matrix layer 104 and the plurality of quantum dots 105 may be formed to cover both the upper surface of the semiconductor substrate 101 and the upper surface of the third semiconductor layer 108.

Figure 8:
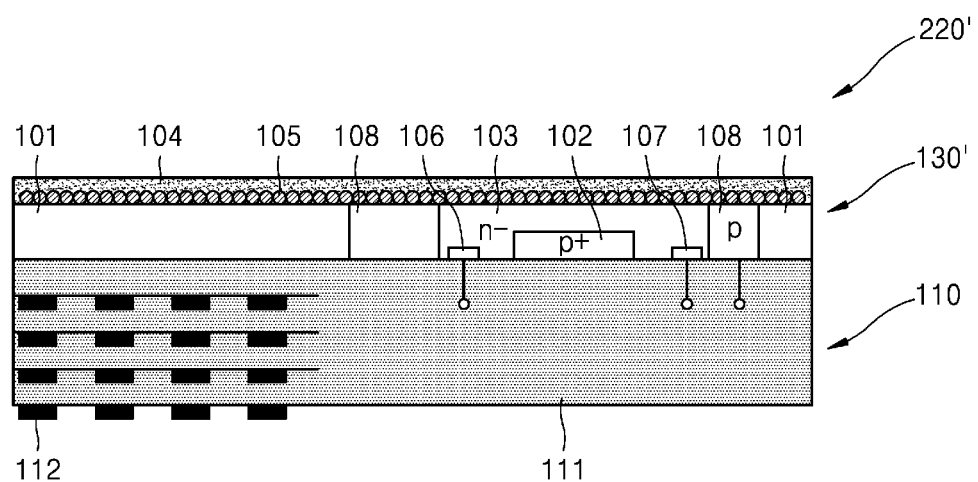
FIG. 8 is a schematic cross-sectional view showing a structure of an opto-electronic device according to another example embodiment.

FIG. 8 is a schematic cross-sectional view showing a structure of an opto-electronic device 220' according to another example embodiment. When compared to the light receiving unit 130 shown in FIG. 6, a third semiconductor layer 108 of the light receiving unit 130' shown in FIG. 8 does not surround an upper surface of the second semiconductor layer 103 and may be arranged only on both sides of the second semiconductor layer 103. Accordingly, the third semiconductor layer 108 is not interposed between the transparent matrix layer 104 or the plurality of quantum dots 105 and the second semiconductor layer 103, and the transparent matrix layer 104 or the plurality of quantum dots 105 may directly contact the second semiconductor layer 103. The opto-electronic device 220' shown in FIG. 8 may be manufactured by polishing an upper region of the semiconductor substrate 101 and an upper region of the third semiconductor layer 108 until the second semiconductor layer 103 is exposed in the process illustrated in FIG. 7D.

As described above, the opto-electronic devices 200, 200', 210, 220, and 220' according to the example embodiments may be easily and inexpensively manufactured by using a general silicon-based complementary metal oxide semiconductor (CMOS) process. Also, since the manufacturing process proceeds in a decreasing process temperature order from a process having a high process temperature, stable manufacturing is possible without any structural damage. According to the manufacturing method, a high-resolution image sensor including a plurality of opto-electronic devices arranged in a two-dimensional array may be easily manufactured.

While the embodiments of opto-electronic devices having a structure of a junction field-effect transistor and methods of manufacturing the same have been described with reference to the accompanying drawings, but this is only exemplary, and it will be understood by those skilled in the art that various changes in form and details may be made therein without departing from the spirit and scope of the inventive concept. Therefore, the embodiments should be considered in descriptive sense only and not for purposes of limitation. The scope of the inventive concept is defined not by the detailed description of the inventive concept but by the appended claims, and all differences within the scope will be construed as being included in the inventive concept.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An opto-electronic device comprising:
a semiconductor substrate;
a light receiving unit formed in the semiconductor substrate; and
a driving circuit arranged on a surface of the semiconductor substrate at a portion of the semiconductor substrate not overlapping the light receiving unit in a plan view, wherein
the light receiving unit comprises:
  a first semiconductor layer arranged in an upper region of the semiconductor substrate and doped with a first conductivity type impurity;
  a second semiconductor layer arranged on the first semiconductor layer and doped with a second conductivity type impurity different from the first conductivity type impurity;
  a transparent matrix layer arranged on an upper surface of the second semiconductor layer;
  a plurality of quantum dots arranged to contact the transparent matrix layer; and
  a first electrode arranged on a first side of the transparent matrix layer and a second electrode arranged on a second side of the transparent matrix layer opposite to the first side, wherein the first electrode and the second electrode are electrically connected to the second semiconductor layer,
wherein the first semiconductor layer is doped to have a first doping concentration and the second semiconductor layer is doped to have a second doping concentration less than the first doping concentration.

2. The opto-electronic device of claim 1, wherein
the plurality of quantum dots are arranged on the upper surface of the second semiconductor layer to be in contact the upper surface of the second semiconductor layer, and the transparent matrix layer is arranged to cover the plurality of quantum dots.

3. The opto-electronic device of claim 1, wherein
the plurality of quantum dots are embedded inside the transparent matrix layer so as not to contact the upper surface of the second semiconductor layer.

4. The opto-electronic device of claim 1, wherein
the transparent matrix layer comprises a transparent oxide semiconductor material.

5. The opto-electronic device of claim 4, wherein
the transparent oxide semiconductor material comprises at least one material selected from silicon indium zinc oxide (SIZO), silicon zinc tin oxide (SZTO), indium gallium zinc oxide (IGZO), indium zinc oxide (IZO), zinc tin oxide (ZTO), $CuAlO_2$, $CuG_2O_2$, $SrCu_2O_2$, or $SnO_2$.

6. The opto-electronic device of claim 1, wherein
the driving circuit comprises:
a plurality of metal layers; and
a dielectric layer interposed between the plurality of metal layers.

* * * * *